United States Patent
Vinet et al.

(10) Patent No.: US 7,491,644 B2
(45) Date of Patent: Feb. 17, 2009

(54) MANUFACTURING PROCESS FOR A TRANSISTOR MADE OF THIN LAYERS

(75) Inventors: Maud Vinet, Grenoble (FR); Pascal Besson, Notre Dame de Mesage (FR); Bernard Previtali, Grenoble (FR); Christian Vizioz, Saint Pierre de Mesage (FR)

(73) Assignees: Commissariat a l'Energie Atomique, Paris (FR); ST Microelectronics SA, Montrouge (FR)

( * ) Notice: Subject to any disclaimer, the term of this patent is extended or adjusted under 35 U.S.C. 154(b) by 512 days.

(21) Appl. No.: 11/223,089

(22) Filed: Sep. 9, 2005

(65) Prior Publication Data
US 2007/0173064 A1 Jul. 26, 2007

(30) Foreign Application Priority Data
Sep. 10, 2004 (FR) .................................. 04 09637
Sep. 17, 2004 (FR) .................................. 04 09894

(51) Int. Cl.
*H01L 21/44* (2006.01)
(52) U.S. Cl. ........................................ 438/669; 438/738
(58) Field of Classification Search ................ 438/287, 438/669, 738; 257/E21.229

See application file for complete search history.

(56) References Cited

U.S. PATENT DOCUMENTS

| 5,599,725 | A | 2/1997 | Dorleans et al. |
| 5,660,681 | A | 8/1997 | Fukuda et al. |
| 6,261,934 | B1 | 7/2001 | Kraft et al. |
| 2004/0113171 | A1* | 6/2004 | Chiu et al. .................. 257/119 |
| 2004/0197977 | A1 | 10/2004 | Deleonibus |

FOREIGN PATENT DOCUMENTS

JP        6-1129872       6/1986

OTHER PUBLICATIONS

Desvoivres et al., "Sub-0.1 μm gate etch processess: Towards some limitations of the plasma technology?," J. Vol. Sci. Technicol. B 18(1), Jan./Feb. 2000, pp. 156-165.

* cited by examiner

*Primary Examiner*—Chandra Chaudhari
(74) *Attorney, Agent, or Firm*—Brinks Hofer Gilson & Lione (57) ABSTRACT

A process for fabricating a transistor that includes a gate located in the immediate proximity of a dielectric includes a step of etching a layer of gate material. The gate etching step includes plasma etching of the gate layer over the major portion of its thickness so as to laterally define the gate and chemical etching of a residual portion of the gate layer so as to define the gate as far as the dielectric.

23 Claims, 6 Drawing Sheets

Fig.1

— PRIOR ART —

Fig.2

— PRIOR ART —

Fig.3

— PRIOR ART —

Fig. 13

MANUFACTURING PROCESS FOR A TRANSISTOR MADE OF THIN LAYERS

PRIORITY CLAIM

This application claims benefit of priority to French Patent Applications No. FR 0409637 filed Sep. 10, 2004, and FR 0409894 filed Sep. 17, 2004, both of which are incorporated herein by reference.

TECHNICAL FIELD

The present invention relates to a process for fabricating a thin-film transistor.

BACKGROUND

A transistor may be produced in thin-film form, as is the case for example in microelectronic circuits. According to one possible design, the channel (produced in a semiconductor material) is separated from the gate by a first thin film (of insulating material) which constitutes the dielectric of the transistor.

The gate can therefore be produced in a second thin film superposed on the dielectric-forming first layer.

Figure 1:
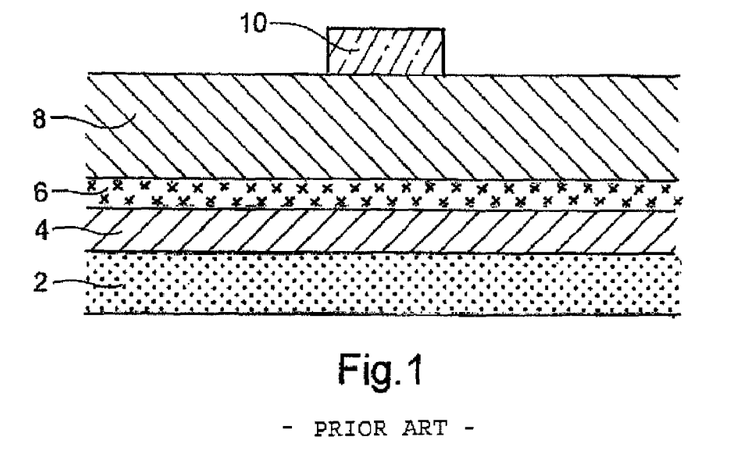
FIGS. 1 to 3 show steps of a process for producing a transistor according to the prior art, as described above.

To define the lateral extension of the gate (that is to say its dimension in a direction perpendicular to the multilayer), one solution consists in using plasma etching, for example using an HBr/$O_2$ etchant. According to this technique, explained here with reference to FIGS. 1 and 2, an etching mask 10 is deposited on the second layer 8 intended to form the gate. In this step, as is visible in FIG. 1, the various layers (especially the channel 4 produced here in the form of a thin film and the dielectric-forming second layer 6) have thicknesses that are essentially constant over their entire width. (For completeness, mention may also be made in the example described here of the buried layer 2 made of insulating material—the assembly comprising the buried layer 2 and the channel 4 being in this example produced by the SOI (silicon-on-insulator) technology).

Figure 2:
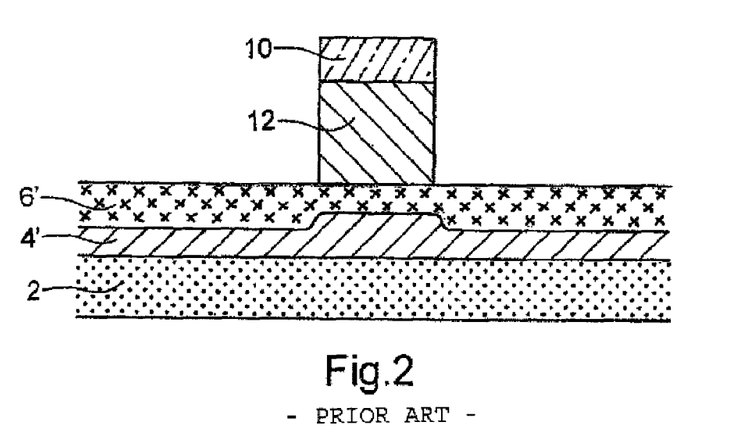

When the structure that has just been described (shown in FIG. 1) undergoes the abovementioned plasma etching, the structure as shown in FIG. 2 is obtained. As desired, the plasma etching makes it possible to obtain a gate 12 of limited lateral extension by removal of the second layer 8 from the regions that are not covered by the etching mask 10.

However, it should be pointed out that, because of the small thickness of the dielectric-forming first layer 6, the plasma etching has caused the upper portions of the channel-forming layer 4 to be oxidized (with the exception of the gate 12, which prevents this oxidation), this having the effect of reducing the thickness of the channel-forming layer represented with its reduced thickness by the reference 4' in FIG. 2. Such a phenomenon has for example been demonstrated in the article "*Sub*-0.1 *μm gate etch processes: towards some limitations of the plasma technology?*" by L. Desvoivres, L. Vallier and O. Joubert, J. Vac. Sci. Technol. B 18(1), January-February 2000.

Figure 3:
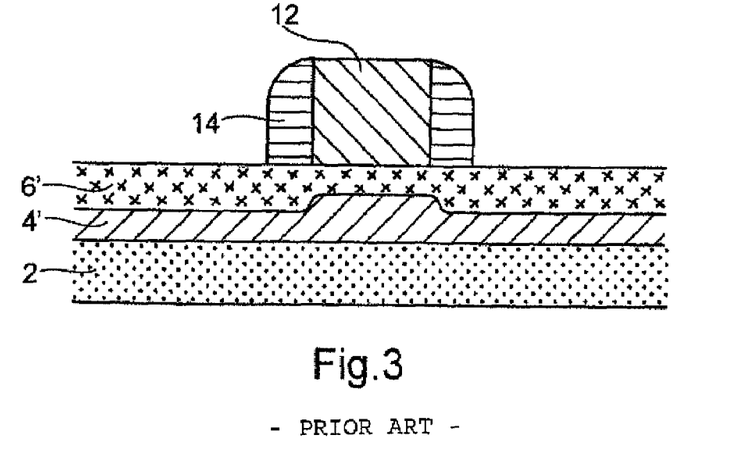

FIG. 3 illustrates the transistor obtained by the process that has just been described and provided with its spacers 14. As anticipated, because of the phenomenon that has just been explained, the thickness of the channel 4' is reduced beneath the spacers 14, resulting in a degradation in the performance of the transistor thus formed, especially by an increase in the channel access resistance which results in a reduction in the saturation current of the transistor.

This performance degradation is also further exacerbated when the lateral dimension of the gate decreases, which is the current tendency in microelectronics.

SUMMARY

To avoid the problems described above, the invention seeks in particular to propose a solution that allows the thickness of the regions located on either side of the channel, and in particular beneath the spacers, to be preserved as far as possible so as, for example, to maintain a layer of constant thickness when the channel is produced in a thin film.

The invention thus proposes a process for fabricating a transistor comprising a gate located in the immediate proximity of a dielectric, which includes a step of etching a layer of gate material, this gate etching step being characterized by the following steps:

plasma etching of this layer over the major portion of its thickness so as to laterally define the gate; and chemical etching of a residual portion of this layer so as to define this gate as far as the dielectric.

Thanks to this design, the plasma etching may be applied only as long as the etching takes place at a sufficient distance from the dielectric, thereby making it possible to reduce, or even eliminate, the deleterious effect of the plasma etching on the adjacent regions of the dielectric, especially on the conducting regions located on either side of the channel.

Using very selective chemical etching with respect to the dielectric, the residual portion is eliminated without, however, being impeded by the deleterious effect due to the plasma etching. Moreover, the chemical etching, although isotropic (this is why it is not used conventionally for this process), does not compromise the lateral definition of the gate since it is used to etch only the residual portion.

In particular, it is possible to use wet chemical etching since, with this type of etching, the diffusion phenomena are very limited, which further helps to prevent the effects of the etching on the buried layers.

For example, the residual portion has a thickness of 10 nm or less, which makes it possible to achieve good definition of the end of the gate by chemical etching despite the isotropy of this method.

The dielectric is produced for example in the form of a silicon oxide layer having a thickness of 3 nm or less.

As a variant, the dielectric may be produced in the form of a layer of high-permittivity material having a thickness of 7 nm or less.

The invention is particularly appropriate under these various conditions, since the dielectric layer then does not make it possible, by itself, to ensure isolation of the conducting portions close to the channel from the deleterious effect of the plasma etching.

In the case of high-permittivity materials, in particular when the dielectric layer is polycrystalline, the invention also makes it possible to avoid structural modifications that would run the risk of appearing through the direct action of the plasma etching on the dielectric layer and that would of course be prejudicial to the rest of the process, especially because the characteristics of the layer would then be uncertain.

The thickness of the dielectric layer is for example between 0.6 nm and 2 nm.

According to a first method of implementation, the layer of gate material comprises a first sublayer covered by a second sublayer, the first sublayer and the second sublayer being produced in different materials.

This method of implementation makes it possible in practice to make a distinction between the portion to be etched by plasma etching and the portion to be etched by chemical etching.

For example, the material of the first sublayer may be less sensitive to the plasma etching than the material of the second sublayer.

According to one possible embodiment, the second sublayer comprises a multilayer.

According to a second embodiment, the layer of gate material is produced in the form of a uniform layer, which simplifies its formation.

Provision may also be made for the step of etching the residual portion to be preceded by a step of implanting a chemical species in the residual portion. This step may facilitate, or make possible, the etching of the residual portion by chemical etching.

The residual portion is produced for example in a material whose work function is tailored to a predefined threshold voltage of the transistor.

The channel may be produced in a thin film, which for example covers a layer of insulation.

In this case, as already mentioned, the invention makes it possible to maintain a constant channel thickness beneath the spacers.

The proposed technique also applies if the channel is formed in a semiconductor substrate, such as a bulk silicon substrate. In this case, the invention also makes it possible to prevent consumption of silicon outside the channel, thereby preventing any degradation in the performance of the transistor, either by obtaining deeper source-drain junctions or by obtaining sources and drains that are more resistive than anticipated, since they are thinner.

The invention is particularly advantageous when the plasma etching uses an oxygen-based end-of-etching step, since this type of plasma etching has a tendency to oxidize the regions located on either side of the channel, which would be located at too short a distance from the site of the etching.

BRIEF DESCRIPTION OF THE DRAWING

Other features and advantages of the invention will become more clearly apparent on reading the description that follows, given with reference to the appended drawings in which.

A first example of a process carried out in accordance with the teachings of the invention will now be described with reference to FIGS. 4 to 9.

Figure 4:
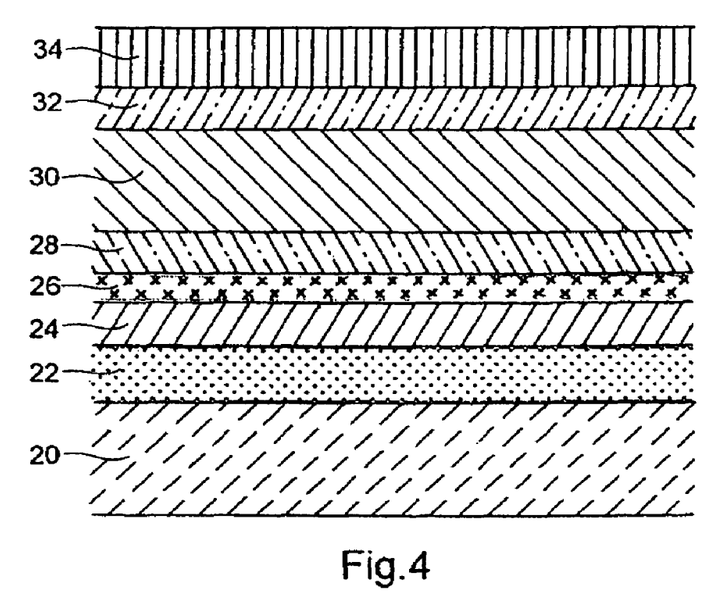
FIGS. 4 to 9 show the main steps of a process for fabricating a transistor in accordance with a first embodiment of the invention.

FIG. 4 shows a structure in the form of layers to which the steps of the process carried out in accordance with the invention will be applied. This structure has eight layers or sublayers, which will now be described, from the deepest layer to the surface layer.

The example shown in FIG. 4 uses an SOI (silicon-on-insulator) structure. As will again be indicated below, the invention is however not limited to transistors based on this type of technology.

DETAILED DESCRIPTION

According to the SOI technique used here, a deep layer 20 of bulk silicon is covered with a silicon oxide layer 22 (sometimes called a buried layer, hence its name "BOx" standing for Buried Oxide), which is itself covered by a thin silicon layer 24 intended to form the channel of the transistor, as will be seen below. The thin silicon layer 24 has for example a thickness of around 10 nm, or even less than 10 nm.

The combination of these three layers is generally called the SOI substrate.

The SOI substrate is covered with a dielectric layer 26 intended to produce the dielectric of the transistor. The dielectric layer 26 is therefore made of an insulating material, for example a silicon oxide. As a variant, it may also be a material of high permittivity (that is to say one whose relative permittivity is greater than 10) such as $ZrO_2$ or $HfO_2$ or $HfSiO_x$. The thickness of the dielectric layer 26 is in general less than that of the channel-forming layer 24 (i.e. here less than 10 nm). The thickness of the dielectric layer 26 is for example around 1 nm (and in general less than 3 nm) when the dielectric layer 26 is made of silicon oxide, or around 3 nm (and in general less than 7 nm) when the dielectric layer 26 is produced in a high-permittivity material.

The dielectric layer 26 is covered with a bilayer composed of a thin sublayer 28 deposited in contact with the dielectric layer 26 and of a thick sublayer 30 that covers the thin sublayer 28.

The thin sublayer 28 is advantageously made of a metal in order to eliminate the gate poly-depletion effects. The material of which said sublayer 28 is made is chosen for its work function, which allows the threshold voltage of the transistor to be regulated. This metal sublayer 28 will advantageously be deposited by CVD (chemical vapor deposition) so as not to create defects in the gate dielectric and to allow deposition as a thin film.

The thick sublayer 30 that covers the thin sublayer 28 may be a conducting layer, thereby making it possible to reduce the overall resistance of the gate if the thin sublayer 28 is resistive. As a variant, this may be an insulating layer. In general, this sublayer 30 is chosen for its ability to be etched by plasma etching and to exhibit chemical etching selectivity with respect to the thin sublayer 28.

For example, it may be chosen to produce the thin sublayer 28 from titanium nitride (TiN) and the thick sublayer 30 from polycrystalline silicon.

The thickness of the thin sublayer 28 is for example around 5 nm, in general between 2 nm and 10 nm. The thick sublayer 30 has a greater thickness, for example between 40 nm and 100 nm.

As a variant, the thin sublayer 28 could be produced in the form of a film of tungsten (W), molybdenum nitride (MoN) or tantalum nitride (TaN) or aluminum (Al).

The bilayer 28, 30 is covered with a mask layer 32 intended to form an etching mask, for example made of silicon oxide ($SiO_2$), which is itself covered with a resist layer 34.

The structure composed of the layers 20 to 34 that has just been described is for example produced by the successive deposition of the layers and sublayers.

Figure 5:
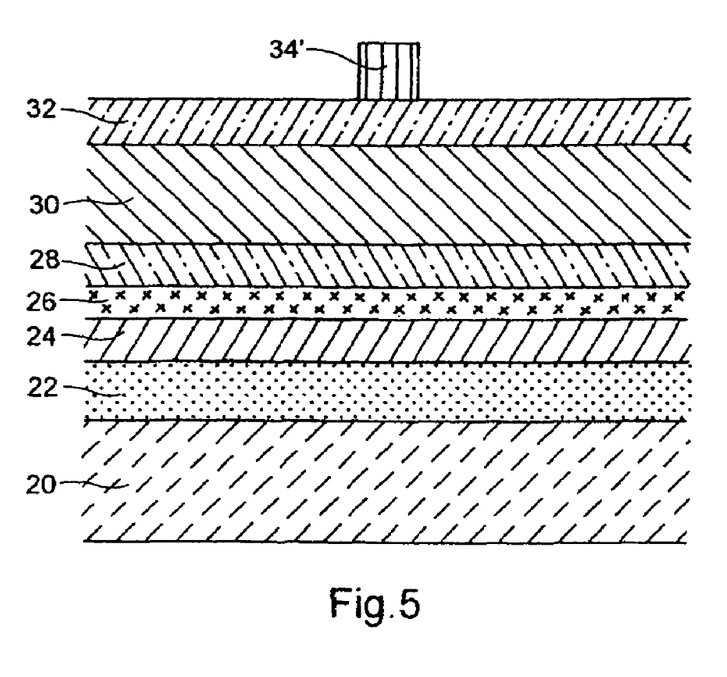

Starting from the structure shown in FIG. 4 that has just been described, features are firstly defined in the resist layer 34, for example by optical or electron lithography. A structure of the type shown in FIG. 5 is then obtained, in which the resist layer 34 is now reduced to features 34' formed in this layer. To simplify the presentation, only a single feature 34' will be described here, this being intended to define the etching mask of the transistor gate, as will be explained below.

The mask layer 32 is then etched, for example by plasma etching, so as to obtain an etching mask 32' used for the plasma etching as will be explained below, and the geometry of which adopts, by definition, that of the resist mask 34' (see FIG. 6).

Figure 7:
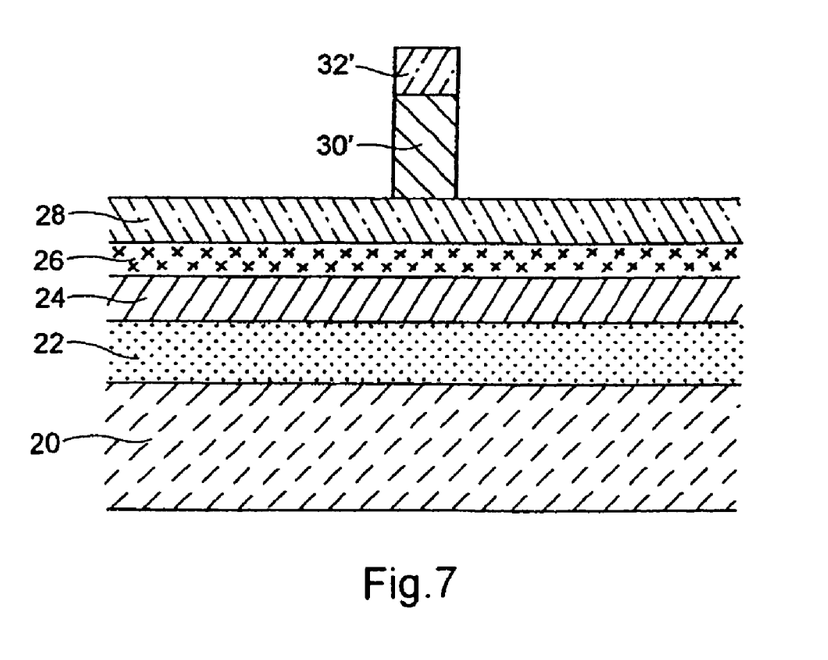

After removal of the resist mask 34', the feature defined by the etching mask 32' is transferred to the thick sublayer 30 by means of plasma etching, for example with an oxygen-based end-of-etching step, specifically in this case using an HBr/$O_2$ etchant. (As a variant, this could be a $Cl_2/O_2$ etchant). This type of etching is highly anisotropic, thereby making it possible to obtain, after etching, a gate 30' whose lateral extension, although reduced (30 nm or less), corresponds specifically to that of the etching mask 32', and to do so despite the large thickness of the thick sublayer 30, as shown in FIG. 7.

The plasma etching is carried out until it reaches the thin sublayer 28, which can be easily detected for example by analyzing the etching residues—the plasma etching must be stopped when the material of the thin sublayer 28 starts to be detected in the etching residues. As a variant, it is possible to use an in situ detection system for detecting the moment when the thin sublayer is exposed.

As a variant, it would be possible to choose the material of the thin sublayer 28 of the bilayer so that it is not impaired by the plasma etching that has just taken place. Thus, the thin sublayer 28 is not modified by the plasma etching.

Over the entire course of the plasma etching, the channel-forming layer 24 is separated from the surface undergoing the plasma etching not only by the dielectric layer 26, but also by the thin sublayer 28. The effects of the plasma etching on the channel-forming layer 24 are therefore very limited, or even completely eliminated, by the presence of the thin sublayer 28.

At this point, it may be mentioned that the term "thin sublayer" given to the sublayer of the bilayer in contact with the dielectric layer 26 is given relative to the thick sublayer 30 that forms the other part of the bilayer. However, as was seen above, the thin sublayer 28 of the bilayer generally has a thickness at least equal to, and in this case greater than, that of the dielectric layer 26. Thus, the presence of thin sublayer 28 makes it possible at least to double the distance separating the site of the plasma etching from the channel-forming layer 24.

As was seen, the plasma etching allows the gate 30' to be defined in the thick sublayer 30, that is to say over a thickness of between 40 nm and 100 nm, in order to take the abovementioned values.

Figure 8:
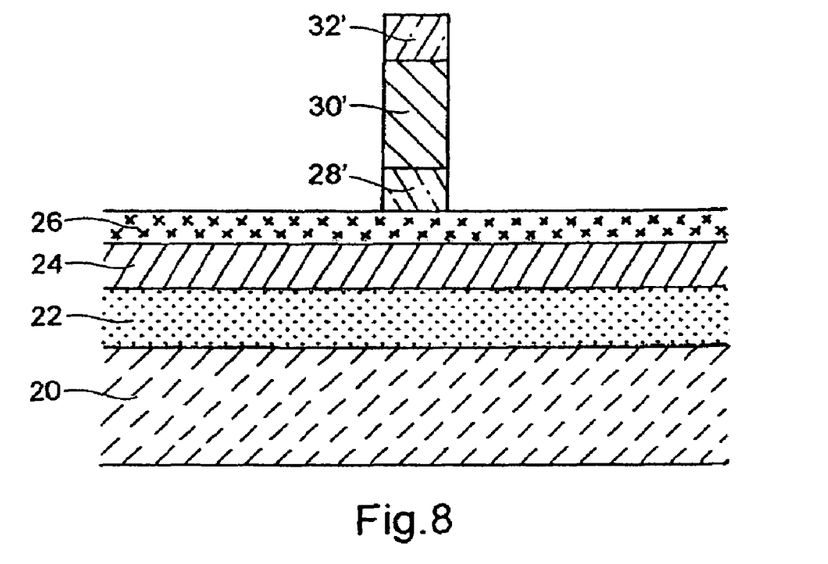

A chemical etching step is then carried out so as to remove those portions of the thin sublayer 28 that are not covered by the gate 30'. In the abovementioned case in which the thin sublayer 28 is made of titanium nitride (TiN), chemical etching of the Standard Clean 2 type is used. If the thin sublayer is made of aluminum, an orthophosphoric acid ($H_3PO_4$) solution may be used. The chemical etching is in any case chosen in such a way that it removes the thin sublayer 28 (except in the regions where this sublayer is covered by the gate 30'), without impairing the gate 30' (here made of silicon) or the dielectric layer 26 (here made of silicon oxide).

As indicated above, the chemical etching however leaves a portion 28' of the thin sublayer 28 remaining beneath the gate 30'. As shown in FIG. 8, the portion 28' resulting from the thin sublayer 28 will complete the gate 30' in its thickness, in this case therefore by extending the gate by a thickness of 10 nm (corresponding to the thickness of the thin sublayer 28 already given as an example).

Owing to the small relative thickness of the sublayer 28 (for example relative to the thickness of the thick sublayer 30)—of 10 nm or less as indicated above, the fact of using chemical etching poses no problem in terms of definition of the lateral extension of the lower portion of the gate 28' despite the isotropy of this etching technique.

As shown in FIG. 8, the gate of the transistor finally consists of a first portion 30' resulting from the thick sublayer 30 and of a second portion 28' resulting from the thin sublayer 28. Thus, the gate has been etched, on the one hand by plasma etching over a substantial portion (here at least 80%) of its thickness and, on the other hand, by chemical etching as regards the remaining portion.

This solution makes it possible to benefit from the high degree of anisotropy of the plasma etching in order to define the dimension of the gate with good definition, without however this plasma etching reducing the thickness of the silicon layer outside the channel formed by the layer 24, and to do so thanks to the presence of the thin sublayer 28 during the plasma etching phase. In addition, the chemical etching step, which completes the etching of the gate, makes it possible to maintain the initial thickness of the silicon layer outside the channel and, because of the small thickness of the thin film, this chemical etching step maintains the dimension defined during the preceding plasma etching step.

Figure 9:
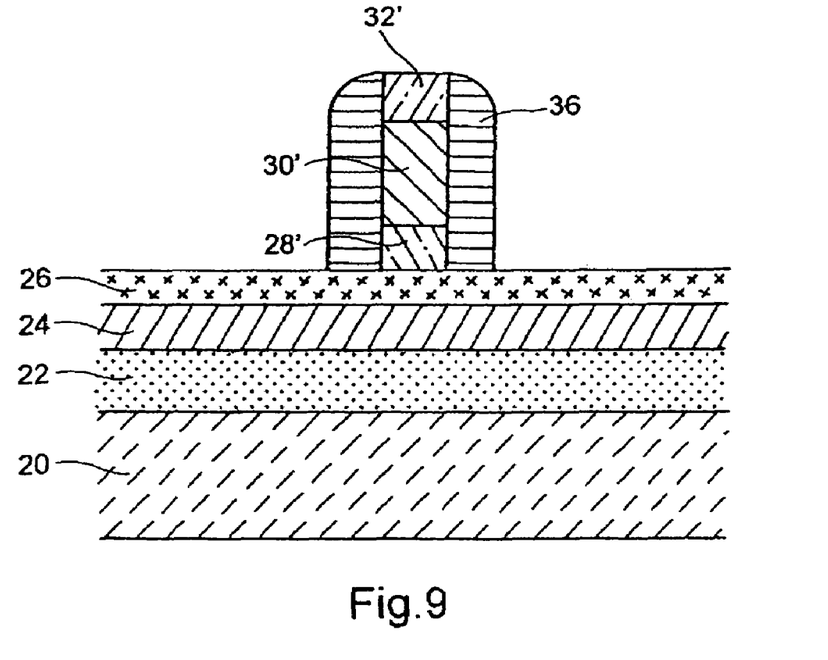

The structure thus obtained makes it possible to produce a transistor whose principal elements, including the spacers 36, are shown in FIG. 9.

As may be seen in FIG. 9, and as already mentioned above, the channel-forming layer 24 has undergone no impairment, especially on either side of the channel, over the course of the preceding fabrication steps. This layer therefore has a constant thickness and will therefore have an optimum access resistance.

It will be noted that it is possible, without departing from the scope of the invention, to use chemical etching that involves the formation of a passivating layer of very small thickness (which protects the lower regions from the oxidation), something which would not be possible with plasma etching.

A second example of a process carried out in accordance with the teachings of the invention will now be described with reference to FIGS. 10 to 13.

Figure 6:
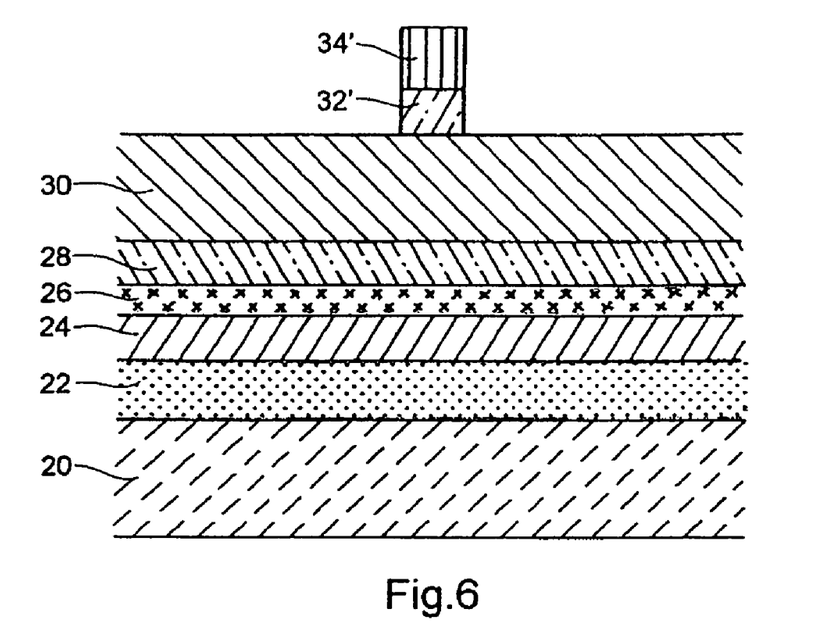
Figure 10:
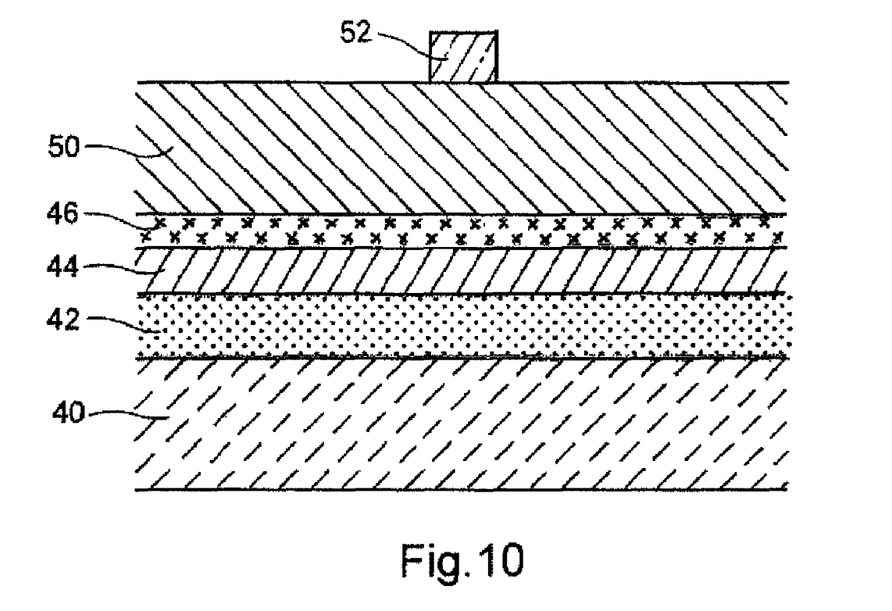
FIGS. 10 to 13 show the main steps of a process for fabricating a transistor in accordance with a second embodiment of the invention.

FIG. 10 shows a thin-film structure similar to that shown in the first embodiment with reference to FIG. 6, with the exception that, in particular, the bilayer 28, 30 of the first embodiment is replaced in this second embodiment (FIG. 10) by a uniform layer 50.

More precisely, the structure used here firstly comprises an SOI substrate formed by a thickness of bulk silicon 40 covered by a buried layer 42 made of insulating material (silicon oxide), which is itself covered by a layer 44 of semiconductor material (here, silicon) intended to form the channel of the transistor.

The SOI substrate, composed of these three elements, is itself covered with a dielectric-forming layer 46 which may also be made of silicon oxide, or of other high-permittivity materials (oxides having a high dielectric constant) as mentioned above. As indicated in the case of the first embodiment of the invention, the thickness of this dielectric-forming layer 46 is typically about 1 nm when it is made of silicon oxide or 3 nm when made of an oxide of high dielectric constant.

The dielectric-forming layer 46 is covered with a thick layer 50 intended to form, after etching for defining its lateral extension, the gate of the transistor.

The thick layer 50 is produced here from polysilicon with a thickness of 60 nm. As a variant, other materials could be used, such as titanium nitride (TiN), tungsten (W), molybdenum nitride (MoN) or tantalum nitride (TaN). The gate material will for example be chosen for its work function, which makes it possible to adjust the threshold voltage of the transistor. So as not to create defects in the gate dielectric, the thick layer 50 may be deposited by CVD (chemical vapor deposition).

The thick layer 50 bears an etching feature 52 which may be defined in a manner similar to the etching mask 32' involved in the first embodiment.

According to the process described here, the structure that has just been described and shown in FIG. 10 is then subjected to plasma etching, here for example using an HBr/$O_2$ etchant. However, the plasma etching is interrupted before this has completely removed those portions of the thick layer 50 that are not located beneath the etching feature 52, so that in this way a residual layer 48 is left, the thickness of which is for example between 5 nm and 10 nm. To do this, an in situ thickness measurement system is used, such as the ellipsometry technique.

Figure 11:
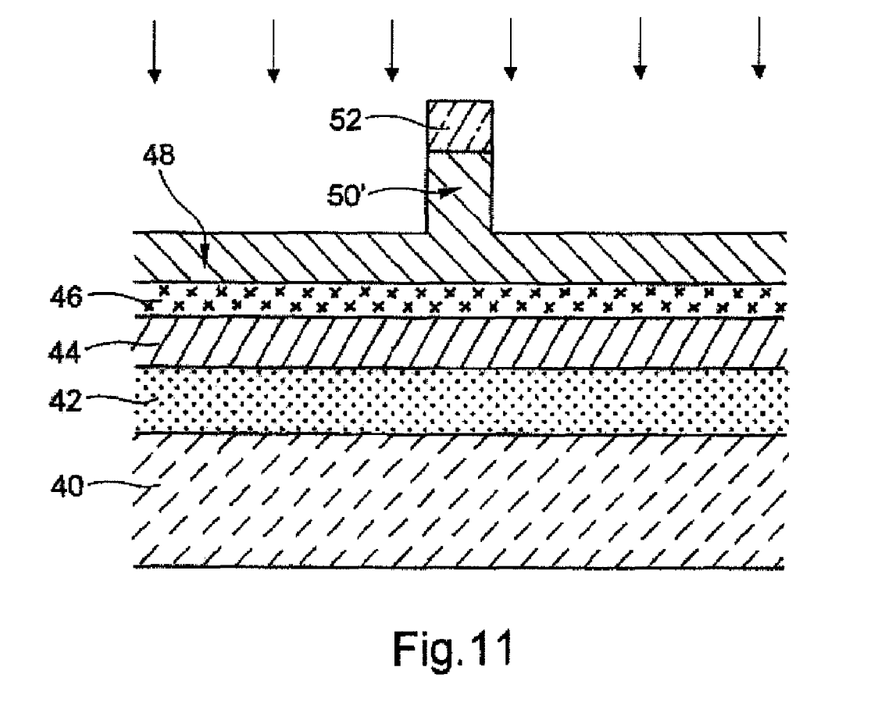

After this partial etching step by plasma etching of thick layer 50, which however makes it possible to define the dimension of the gate 50' over a substantial portion of its thickness (here at least over a thickness of 50 nm to be compared with the initial thickness of the 60 nm thick layer 50), what is obtained is the structure shown in FIG. 11. Beneath the etching feature 52, the thick layer 50 remains unchanged, so as to define the gate 50'. Outside of the etching feature 52, only a residual layer 48 remains (with a composition identical to that of the thick layer 50 from which it was formed).

Owing to the interruption to the plasma etching before it has completely removed the thick layer in the regions located outside the gate 50', the site of the etching is again separated from the channel-forming layer 44 not only by the dielectric-forming layer 46 but also by the residual layer 48 (i.e. by a minimum distance of 8 nm if a dielectric-forming layer 46 of about 3 nm thickness and a residual layer 48 of at least 5 nm thickness, as indicated above, are used). Thus, the plasma etching step will not impair the channel-forming layer 44 (and especially in the case of plasma etching with an HBr/$O_2$ etchant, no oxidation of the portions lying on either side of the channel).

A chemical species is then implanted into the residual layer 48. To do this, it is possible for example to use a low-energy ion implantation operation.

In the case described here, in which the thick layer 50 is made of polysilicon, boron may be implanted with an energy of 250 eV or germanium with an energy of 3 keV. To sufficiently modify the composition of the residual layer 48 by this implantation, high implantation doses, for example greater than $10^{15}$ at.cm$^{-2}$, will be chosen.

Figure 12:
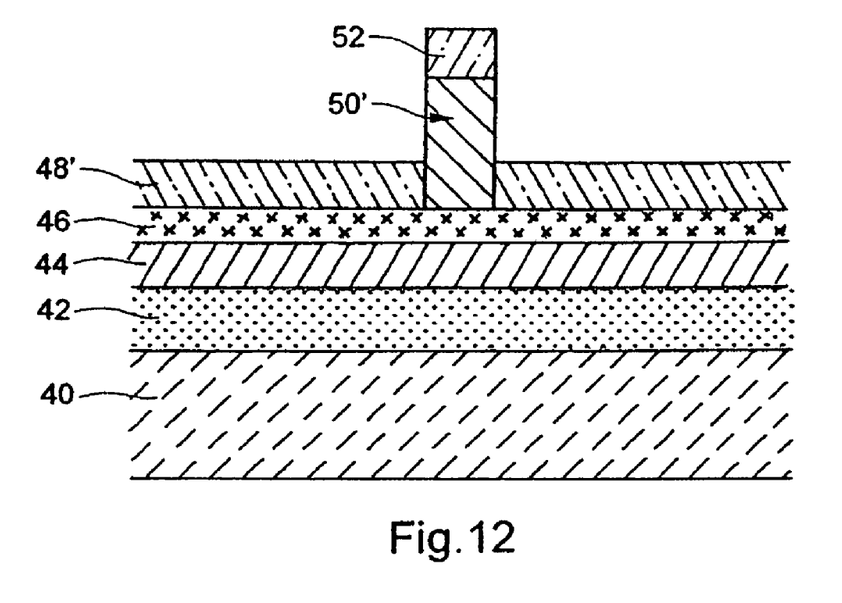

The structure shown in FIG. 12 is thus obtained. The regions 48' of the residual layer that are not located beneath the etching feature 52, that is to say that are not located in the region of the gate 50', have undergone the implantation and their chemical composition is therefore substantially modified. That region of the residual layer 48 which is located beneath the gate 50' has not undergone implantation owing to the protection formed by this same gate 50', and this region therefore has an unchanged composition that forms an extension of the gate 50'.

The portions 48' of the residual layer whose chemical composition has been modified are then removed by chemical etching. Of course, for this etching a chemical agent is chosen which will react with the implantation-doped portion 48' but which leaves the gate 50' (here made of silicon) and the lower layers, especially the dielectric-forming layer, intact.

If the implanted species is boron, as proposed above, the chemical etching (here in particular wet chemical etching) is carried out for example by means of a TMAH (tetramethylamonium hydroxide) solution.

If the implanted species is germanium (also given as an example above), it is possible to use, for the chemical etching, a solution of acetic acid, hydrofluoric acid and hydrogen peroxide, or a solution of acetic acid, hydrofluoric acid and nitric acid.

Figure 13:
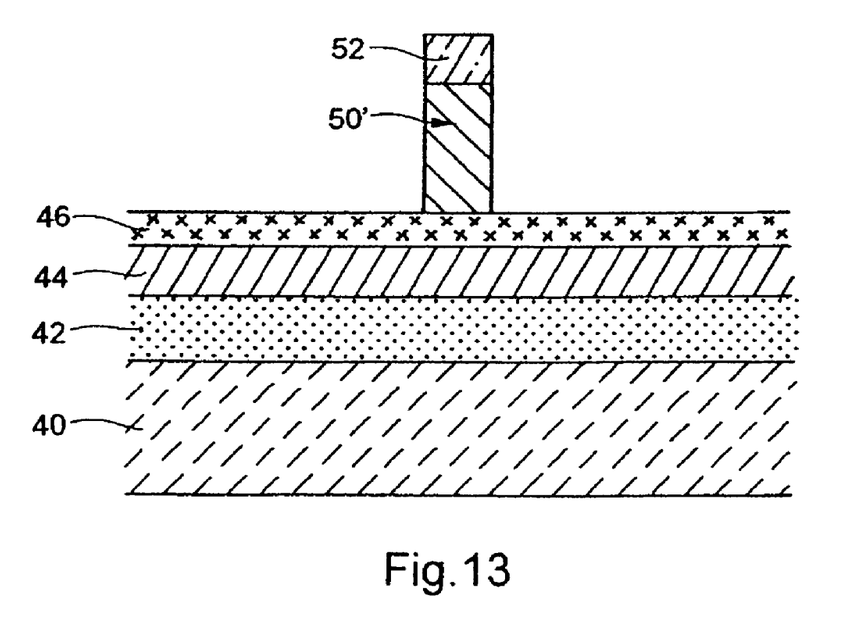

What is then obtained is the structure shown in FIG. 13, on the base of which a transistor with satisfactory electrical properties may be produced, especially by using a channel-forming layer 44 of constant thickness, the dielectric-forming layer 46 and the gate 50' etched in the thick layer 50.

The examples that have just been given are merely possible methods of implementing the invention.

As already mentioned, the invention is particularly applicable when the starting substrate is not an SOI substrate, as in the above examples, but a bulk silicon substrate. In this case, as in the above examples, the invention prevents consumption of silicon outside the channel, thereby preventing the performance of the transistor from being degraded either by obtaining deeper source-drain junctions or by obtaining sources and drains that are more resistive than anticipated, as they are thinner.

Moreover, a step of implanting the residual portion of the layer of gate material could for example also be carried out if the layer of gate material is formed by two sublayers in different materials.

The invention claimed is:

1. A process for fabricating a transistor comprising a gate located in immediate proximity to a dielectric layer comprising silicon oxide having a thickness of less than about 3 nm, the process comprising:
    etching a layer of gate material, the etching step including,
    plasma etching the layer of gate material over a major portion of thickness so as to laterally define the gate and leaving a residual portion of the layer of gate material; and
    implanting a chemical species into the residual portion and chemically etching the residual portion so as to define the gate on the dielectric layer.

2. The process according to claim 1, wherein the residual portion has a thickness of about 10 nm or less.

3. The process according to claim 1, wherein the dielectric layer has a thickness of less than about 2 nm.

4. The process according to claim 3, wherein the dielectric layer has a thickness of greater than about 0.6 nm.

5. The process according to claim 1, wherein the layer of gate material comprises a first sublayer covered by a second sublayer, the first sublayer and the second sublayer comprising different materials.

6. The process according to claim 5, wherein the first sublayer comprises a material less sensitive to the plasma etching than the second sublayer.

7. The process according to claim 5, wherein the second sublayer comprises a multilayer.

8. The process according to claim 1, wherein the layer of gate material comprises a uniform layer.

9. The process according to claim 1, wherein the plasma etching further comprises an oxygen-based end-of-etching step.

10. The process according to claim 1, wherein the chemical etching comprises wet chemical etching.

11. The process according to claim 1, wherein the residual portion comprises a material whose work function is configured to provide a predefined threshold voltage of the transistor.

12. A process for fabricating a transistor comprising a gate located in immediate proximity to a dielectric layer, the process comprising:

etching a uniform layer of gate material, the etching step including plasma etching of the uniform layer of gate material over a major portion of thickness so as to laterally define the gate;

implanting a chemical species in a residual portion of the uniform layer; and chemically etching the residual portion so as to define the gate on the dielectric layer.

13. A process for fabricating a transistor comprising a gate located in proximity to a dielectric layer of high permittivity material having a thickness of about 7 nm or less, the process comprising:

etching a layer of gate material, etching step including, plasma etching the layer of gate material over the major portion of thickness so as to laterally define the gate and leaving a residual portion of layer of gate material; and implanting a chemical species into the residual portion and chemically etching the residual portion so as to define the gate on the dielectric layer.

14. The process according to claim 13, wherein the residual portion has a thickness of about 10 nm or less.

15. The process according to claim 13, wherein the dielectric layer has a thickness of less than about 2 nm.

16. The process according to claim 15, wherein the dielectric layer has a thickness of greater than about 0.6 nm.

17. The process according to claim 13, wherein the layer of gate material comprises a first sublayer covered by a second sublayer, the first sublayer and the second sublayer comprising different materials.

18. The process according to claim 17, wherein the first sublayer comprises a material less sensitive to the plasma etching than the second sublayer.

19. The process according to claim 17, wherein the second sublayer comprises a multilayer.

20. The process according to claim 13, wherein the layer of gate material comprises a uniform layer.

21. The process according to claim 13, wherein the plasma etching further comprises an oxygen-based end-of-etching step.

22. The process according to claim 13, wherein the chemical etching comprises wet chemical etching.

23. The process according to claim 13, wherein the residual portion comprises a material whose work function is configured to provide a predefined threshold voltage of the transistor.

* * * * *